July 22, 1969 M. F. AMSTERDAM ET AL 3,457,467

HETEROJUNCTION SOLAR CELL WITH SHORTED SUBSTRATE

Filed June 3, 1965

INVENTORS
Michael F. Amsterdam
& Dale M. Whigham

BY

Gordon H. Telfer
ATTORNEY

United States Patent Office 3,457,467

Patented July 22, 1969

3,457,467

HETEROJUNCTION SOLAR CELL WITH SHORTED SUBSTRATE

Michael F. Amsterdam, Greensburg, and Dale M. Whigham, Ruffsdale, Pa., assignors to Westinghouse Electric Corporation, Pittsburgh, Pa., a corporation of Pennsylvania Filed June 3, 1965, Ser. No. 461,051

Int. Cl. H01l 3/00, 5/00

U.S. Cl. 317—234 5 Claims

ABSTRACT OF THE DISCLOSURE

This invention provides a solar cell wherein a substrate acts only as a support member. Material for the solar cell is deposited on the substrate. A wrap around electrical contact shunts, or short circuits, any P-N junction formed by the deposited material and the substrate but not the P-N junction of the solar cell. The electrical contact is alloyed to the substrate and to the deposited material at the same time that the diffusion of a region of desired semiconductivity is taking place in the deposited material to form the diode of the solar cell.

This invention relates to solar cells, and more particularly to improvements in the production of solar cells of the type wherein a layer of semiconductor material is supported on a substrate of low resistivity.

As an overall object, the present invention seeks to provide an improved method for manufacturing semiconductor devices, particularly gallium arsenide solar cells.

Another object of the invention is to provide a solar cell wherein semiconductor material having a P-N junction formed therein is supported on a substrate for the purpose of increasing the overall strength of the solar cell.

Another object of the invention is to provide a solar cell wherein an undesirable P-N junction between the cell itself and a supporting substrate is short-circuited, thereby increasing the power output of the cell.

Still another object of the invention is to provide an improved method for producing solar cells wherein diffusion of a dopant into the upper surface of a layer of semiconductor material and alloying of the metal coating on the substrate and surface metallic contacts are accomplished simultaneously.

While not limited thereto, the invention is particularly adapted for use in the manufacture of solar cells of the type in which gallium arsenide is deposited epitaxially upon a germanium dendritic web. Previous attempts at manufacturing such devices having resulted in P-on N cells whose open circuit voltages were under 0.2 volt. As will be understood, the low circuit voltage results from an N-P junction formed at the gallium arsenide-germanium interface, regardless of the conductivity type of the germanium web substrate.

In accordance with the present invention, the foregoing disadvantages of gallium arsenide-germanium solar cells are overcome by coating the edges and bottom surface of the solar cell with a noble metal incorporating an N-type dopant (for germanium) element which is present in an amount sufficient to insure the formation of an ohmic contact between the noble metal and the germanium substrate. Thereafter, a dopant element is diffused into the gallium arsenide layer to provide an upper region having a conductivity type opposite to the conductivity type of the lower gallium arsenide layer. In the diffusion process, the noble metal and the germanium substrate mask the underside of the gallium arsenide layer such that the region of opposite conductivity type, a few microns in thickness, is at the top surface of the gallium arsenide layer only.

The time and temperature employed in diffusing the dopant into the upper surface of the gallium arsenide surface are sufficient to cause the noble metal coating to form an alloy with the germanium web substrate with which it is in contact. Hence, diffusion and alloying are accomplished simultaneously. The noble metal coating extends over the undesirable P-N junction at the gallium arsenide-germanium interface at the edges of the unit and short-circuits the same; however, similar short-circuiting of the desired P-N junction formed in the gallium arsenide is prevented by beveling the upper edges of the coating to the extent that it will not bridge the desired P-N junction.

The above and other objects and advantages of the present invention will become apparent from a following detailed description by reference to the accompanying drawings, in which.

Figure 1:
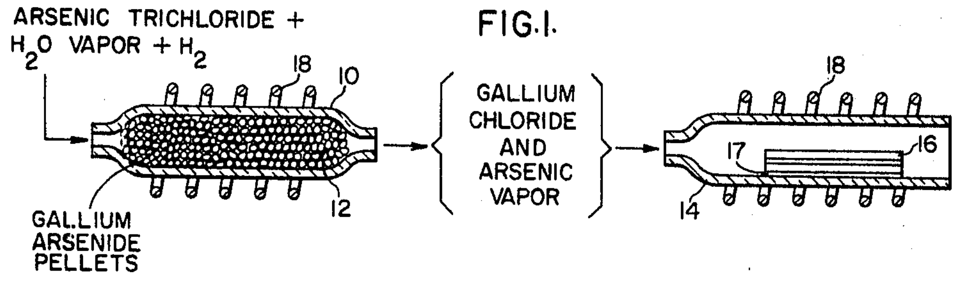
FIGURE 1 is a schematic illustration of a preferred method for depositing a semiconductor layer on one surface of a substrate.

Referring now to FIG. 1, apparatus is schematically illustrated for depositing a layer of semiconductor material on a substrate web. As can be seen, a tube 10 is provided in which is placed gallium arsenide pellets 12. The tube 10 has an opening at its left end through which is introduced arsenic trichloride, $H_2O$ vapor and hydrogen. The mixture passes through the tube 10 wherein a reaction takes place producing gallium chloride and arsenic vapor which exists through an opening provided in the right end of the tube 10.

The gallium chloride and arsenic vapor are introduced into epitaxial growth apparatus which includes a tube 14 having a wafer 16 positioned therein on a quartz boat 17. The wafer 16 is a segment of germanium dendritic web and serves as the substrate for the gallium arsenide epitaxial layer which is to be deposited. Surrounding the tubes 14 and 10 are resistance heater coils 18 which maintain the desired temperature gradient between source and substrate. The tube 14 is open at its right end and is provided with an opening on its left end through which the gallium chloride and arsenic vapor are introduced.

These reaction gases, comprising gallium chloride and arsenic vapor flow through the tube 14, react on the surface of the wafer 16, forming epitaxial gallium arsenide, and the other reaction products thereafter pass through the open or right end of the tube 14. The process is continued until from about 50 to 100 mils of N-type gallium arsenide have been deposited on the surface of the wafer 16.

When the wafer 16 is removed from the tube 14, it will have a gallium arsenide layer 20 overlying the top surface.

Figures 2, 3, 4, 5:
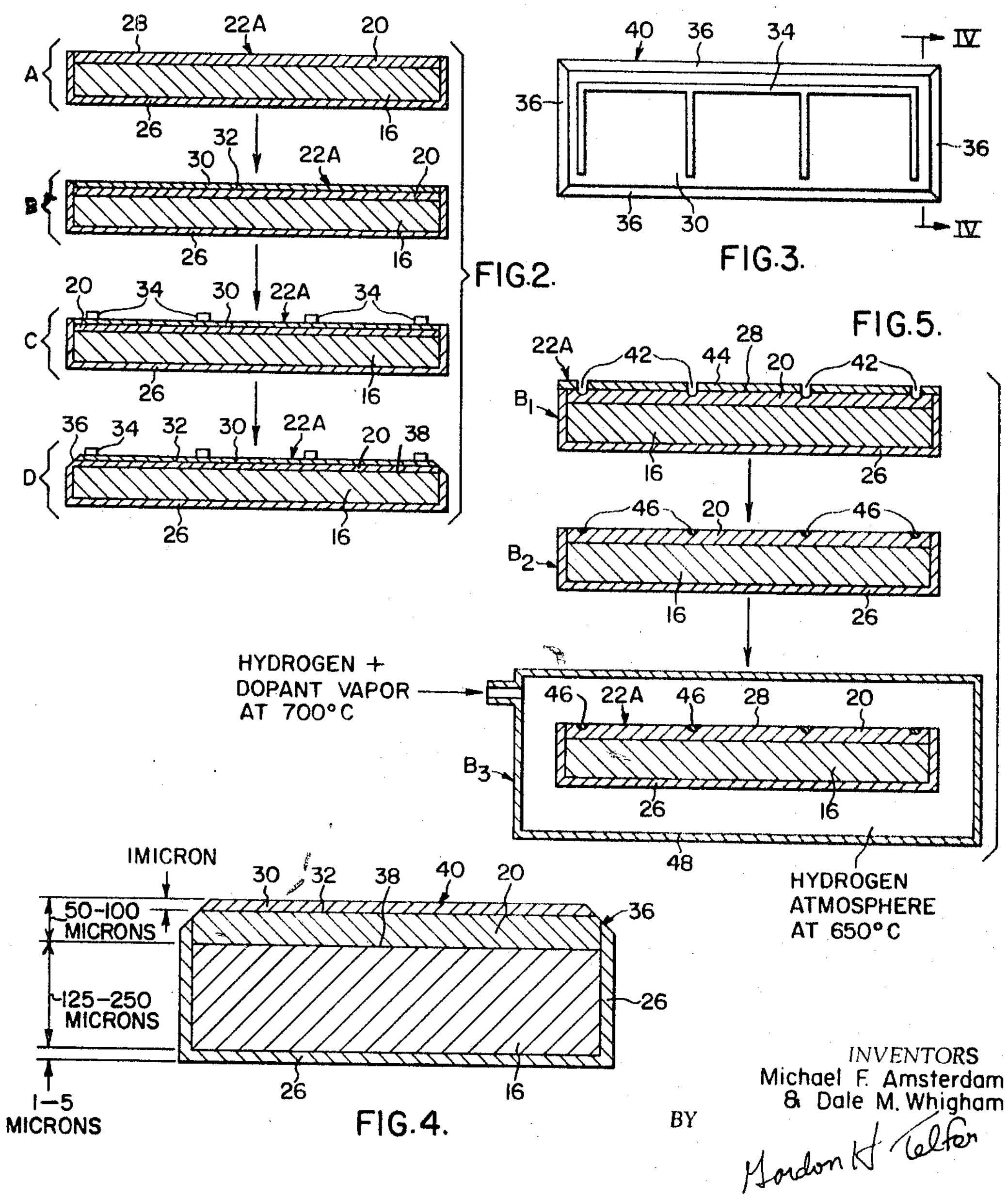
FIG. 2 is a schematic illustration of the steps for carrying out the process of the invention.
FIG. 3 is a plan view of a solar cell produced in accordance with the process of the present invention.
FIG. 4 is a cross-sectional view, drawn on an enlarged scale and taken along the line IV—IV of FIG. 3, illustrating certain principles of the invention.
FIG. 5 is a schematic view further illustrating a combined alloying-diffusion step employed in the process of the invention.

Reference is now directed to FIG. 2 wherein the process steps necessary to complete the solar cell are illustrated. The wafer 16, with gallium arsenide layer 20, is first subjected to a coating step, step A, wherein the sides and bottom are coated with a noble metal. A coating 26 of noble metal is applied to the bottom face of the substrate 16 and along all exposed edges of the substrate 16 and the gallium arsenide layer 20. The noble metal of coating 26 is selected from the group consisting of gold and silver, and has dissolved therein an element selected from the group consisting of antimony, arsenic and phosphorus. This dopant element is present in an amount sufficient to insure the formation of an ohmic contact between the noble metal and the germanium substrate 16. The coating of noble metal may be applied, for example, by evaporation in a vacuum. The coating step results in a unit, designated 22A, which comprises a gallium arsenide layer 20 supported on a germanium web substrate 16 and having a coating of noble metal applied only to the bottom face of the substrate 16 and the edges of the substrate 16 and the gallium arsenide layer 20. In the unit 22A, the gallium arsenide layer 20 has an exposed upper surface 28.

In step B, to be more fully described in conjunction with FIG. 5, the exposed upper surface 28 of the gallium arsenide layer 20 is exposed to a vaporized dopant which diffuses into the gallium arsenide layer 20 to a depth of about one micron and in sufficient quantity to overpower the original doping. Hence, an outer region 30 is provided having a conductivity type (in this case P-type) which is opposite to the conductivity type of the original gallium arsenide layer 20. The result is a P-N junction 32 about one micron below the exposed surface 28 of the gallium arsenide layer 20. This dopant is preferably, selected from the group consisting of zinc, cadmium and magnesium.

The process by which the dopant is diffused into the exposed surface 28 of the gallium arsenide layer 20, also causes the noble metal coating 26 to form an alloy with the germanium web substrate 16 with which it is in contact. Hence, in step B, diffusion of the dopant and alloying of the noble metal coating 26 are accomplished simultaneously. Furthermore, the noble metal coating 26 and the substrate 16 mask the gallium arsenide layer 20 whereby only the upper surface 28 of the gallium arsenide layer 20 is subjected to the diffusing dopant.

In step C, a solder or grid preform 34 is applied to the upper region 30 and fused thereto by conventional methods.

In step D, the noble metal coating 26 is removed from the upper edge of the unit 22A, for example, by lapping a bevel 36 completely around the periphery of the unit. In this manner, the noble metal coating 26 is removed to the extent that it will not affect the desired P-N junction 32 formed between the outer region 30 and the remainder of the gallium arsenide layer 20. It will be noted, however, that the noble metal coating 26 does extend across an undesirable junction 38 formed at the interface of the gallium arsenide layer 20 and the germanium web substrate 16 and, therefore, this junction 38 is shunted or short circuited.

Reference is now directed to FIGS. 3 and 4 wherein there is illustrated a typical solar cell 40 formed by the above-described process. The solar cell 40 is generally rectangular in shape and has the solder preforms 34 fused to the upper surface thereof. As can best be seen in FIG. 4, the germanium web substrate 16 has a thickness in the range of from about 125 to 250 microns. The gallium arsenide layer 20 has a thickness in the range of from about 50 to 100 microns, while the outer region 30, provided by the diffused dopant, penetrates the gallium arsenide layer 20 to a depth of about 1 micron. The noble metal coating 26 has a thickness of about 1 to 5 microns.

As a specific example of a solar cell produced by the method of the present invention, the various regions of the solar cell 40 (FIG. 4) have been labeled. The germanium web substrate 16 is N-type. The gallium arsenide layer 20 is preferably an N-type. The dopant diffused into the upper surface of the gallium arsenide layer 20 to provide the outer region 30 converts the outer region 30 to a P-type conductivity. Therefore, the junction 32 between the outer region 30 and the remainder of the gallium arsenide layer 20 is a P-N junction. The junction 38 formed at the interface of the gallium arsenide layer 20 and the germanium web substrate 16 is an N-P junction, such being the case regardless of the original conductivity type of the substrate. The element dissolved in the nobel metal coating 26 is selected from the group consisting of antimony, arsenic and phosphorus. The element is present in the coating 26 in an amount sufficient to insure the formation of an ohmic contact between the coating 26 and the germanium substrate 16.

As can best be seen in FIG. 3, the bevel 36 is provided along the entire upper edge of the solar cell 40. As illustrated in FIG. 4, the noble metal coating 26 does not extend across and therefore does not affect the desired P-N junction 32. The nobel metal coating 26 does, however, extend across the undesired N-P junction 38 and short-circuits the same. Thus, when a plurality of the solar cells 40 are connected in series, for example, to generate power, current flow will be from the noble metal coating 26 into the gallium arsenide layer 20 and across the P-N junction 32 into the outer region 30. In the absence of the noble metal coating 26 an opposing current would be setup across the N-P junction 38 which would lower the power output of the solar cell. In the solar cell 40, however, the nobel metal coating 26 short-circuits or shunts the N-P junction 38 nullifying the effects of the opposing current. The noble metal coating 26 does not, however, extend across the desired P-N junction 32 and hence does not affect the flow of current thereacross.

Reference is now directed to FIG. 5 wherein the combined diffusing-alloying operation, that is, step B of FIG. 2, is more fully illustrated. Initially, a pattern of grooves 42 is sandblasted in the exposed surface 28 of the gallium arsenide layer 20 using a metallic mask 44, as illustrated in $B_1$ of FIG. 5. The unit 22A is then subjected to a plurality of etches, of short duration, in a suitable etching solution each as hydrofluoric acid, acetic acid and nitric acid present in the volume ratio of 4:2:1, respectively. Using the metallic mask 44, a grid pattern 46 (shown in $B_2$ of FIG. 5) is applied to the grooves 42, preferably by evaporation in vacuum, using a silver-zinc alloy containing, for example, 20% by weight of zinc in silver.

As shown in step $B_3$, the unit 22A is then placed in a vessel 48 containing a hydrogen atmosphere. The unit 22A as well as the hydrogen are preheated to 650° C. for about four minutes at which time a powdered dopant selected from the group consisting of zinc, cadmium and magnesium, is introduced into a separate 700° C. zone (not shown). Hydrogen is then caused to flow through the 700° C. zone into the vessel 48. The hydrogen picks up dopant vapor in the 700° C. zone and carries the same into the vessel 48 at which time a portion of the dopant diffuses into the upper surface 28 of the gallium arsenide layer 20. The diffusing time ranges from about 1 minute to about 5 minutes and results in a junction depth of the order of 1 micron.

As stated above, the noble metal is selected from the group consisting of gold and silver. The eutectic of gold and germanium occurs at 398° C. for twelve weight percent germanium and eighty-two weight percent gold. The eutectic of silver and germanium occurs at 651° C. for 19 weight percent germanium and 81 weight percent silver. Hence, the time and temperature employed for diffusion of the dopant, has been found to be sufficient to simultaneously cause alloying of the noble metal with the germanium web substrate 16. Therefore, the process of the invention combines into one step that which has previously required two separate steps.

It is important to note that the nobel metal coating 26 serves also to mask the edges of the gallium arsenide layer 20 from reaction with the diffusing dopant. At the completion of the combined diffusing-alloying operation, the unit 22A will, as illustrated in step B of FIG. 2, have the outer region 30 into which the dopant is diffused and the desired junction 32.

It is to be understood that the simultaneous diffusion of impurities to form the surface layer 30 and alloying of ohmic contact 46 to surface layer 30 may be performed independently of the alloying of layer 26. The metal for contact 46 should alloy with the semiconductor at the diffusion temperature. It should have an alloying temperature within no more than 50° C. below the diffusion temperature to avoid fusion of metal completely through the diffused surface layer. The silver-zinc alloy employed in the above example alloys to GaAs at or slightly less than 650° C. Suitable metals may be selected for use as surface contacts on other semiconductor materials that permit simultaneous diffusion and alloying to the diffused region. Following the alloying and diffusion operation, the conductivity of the contact 46 may be improved by application of a solder layer 34 as shown in FIG. 2C.

Although the invention has been shown in connection with one specific example, it will be readily apparent to those skilled in the art that various changes may be made to suit requirements without departing from the spirit and scope of the invention.

We claim as our invention:

1. A solar cell comprising a substrate formed from a semiconductor material, a layer of semiconductor material of one conductivity type deposited on one face of said substrate and having a region of opposite conductivity type diffused into its upper surface, a first P-N junction formed at the interface of said layer and said substrate's surface, a second P-N junction formed at the interface of said region and said layer, the semiconductor materials of said substrate and said layer being different, and an electrically conductive material deposited on the remaining faces of said substrate and extending across said first P-N junction but terminating along a line spaced from said second P-N junction.

2. A solar cell comprising a substrate formed from a semiconductor material, a layer of semiconductor material of one conductivity type deposited on one face of said substrate and having a region of opposite conductivity type diffused into its upper surface, a first P-N junction formed at the interface of said layer and said substrate's surface, a second P-N junction formed at the interface of said region and said layer, the semiconductor materials of said substrate and said layer being different, and electrically conductive material deposited on the remaining faces of said substrate and extending across said first P-N junction, said electrically conductive material incorporating a dopant element in an amount sufficient to insure the formation of an ohmic contact between said electrically conductive material and the substrate material the upper edge of said solar cell being removed whereby said electrically conductive material is also removed to the extent that it does not shunt said second P-N junction formed between said region and the remainder of said layer of semiconductor material.

3. A solar cell comprising a substrate formed from semiconductor material, a layer of semiconductor material of one conductivity type deposited on one face of said substrate and having a region of opposite conductivity type diffused into its upper surface, a first P-N junction formed at the interface of said layer and said substrate's surface, a second P-N junction formed at the interface of said region and said layer, the semiconductor materials of said substrate and said layer being different, and a layer of noble metal selected from the group consisting of gold and silver deposited on the remaining surfaces of said substrate and extending across said first P-N junction and terminating along lines spaced from said second P-N junction, said layer of noble metal incorporating an element selected from the group consisting of antimony, arsenic and phosphorus in an amount sufficient to insure the formation of an ohmic contact between said noble metal and the semiconductor material of said substrate.

4. A solar cell comprising a substrate formed from a semiconductor material, a layer of N-type semiconductor material deposited on one face of said substrate, a first P-N junction formed at the interface of said layer and said substrate's surface, a second P-N junction formed at the interface of said region and said layer, the semiconductor materials of said layer and said substrate being different, said layer of semiconductor material having a dopant selected from the group consisting of zinc, cadmium and magnesium diffused into its upper surface so as to provide a region of P-type conductivity type at its upper surface, and a layer of noble metal selected from the group consisting of gold and silver deposited on the remaining faces of said substrate and extending across said first P-N junction and terminating along lines spaced from said second P-N junction, said layer of noble metal incorporating a dopant selected from the group consisting of antimony, arsenic and phosphorus in an amount sufficient to insure the formation of an ohmic contact between said noble metal and the semiconductor material of said substrate.

5. A solar cell comprising a substrate formed from a segment of a germanium dendritic web, a layer of N-type gallium arsenide deposited on one face of said substrate and having a dopant selected from the group consisting of zinc, cadmium and magnesium diffused into its upper face to provide a region of P-type conductivity type and hence a P-N junction, and a layer of a noble metal selected from the group consisting of gold and silver deposited on the remaining faces of said substrate and extending across the interface between said substrate and said gallium arsenide layer but not across said P-N junction, said layer of noble metal incorporating an element selected from the group consisting of antimony, arsenic and phosphorus in an amount sufficient to insure the formation of an ohmic contact between said noble metal and said substrate.

References Cited

UNITED STATES PATENTS

| | | | |
|---|---|---|---|
| 2,994,054 | 7/1961 | Peterson | 338—19 |
| 3,082,283 | 3/1963 | Anderson | 136—89 |
| 3,267,338 | 8/1966 | Marinace | 317—234 |
| 3,249,473 | 5/1966 | Holonyak | 148—175 |
| 3,369,132 | 2/1968 | Fang et al. | 307—299 |

JOHN W. HUCKERT, Primary Examiner

R. SANDLER, Assistant Examiner

U.S. Cl. X.R.

250—211